United States Patent
Ning et al.

(10) Patent No.: US 9,606,432 B2
(45) Date of Patent: Mar. 28, 2017

(54) ALTERNATING SPACE DECOMPOSITION IN CIRCUIT STRUCTURE FABRICATION

(71) Applicant: GLOBALFOUNDRIES INC., Grand Cayman (KY)

(72) Inventors: Guoxiang Ning, Ballston Lake, NY (US); Xintuo Dai, Clifton Park, NY (US); Huang Liu, Mechanicville, NY (US); Chin Teong Lim, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/533,464

(22) Filed: Nov. 5, 2014

(65) Prior Publication Data

US 2016/0124308 A1    May 5, 2016

(51) Int. Cl.
*G03F 7/00* (2006.01)
*G03F 7/09* (2006.01)
*G03F 7/20* (2006.01)

(52) U.S. Cl.
CPC ............ *G03F 7/0035* (2013.01); *G03F 7/094* (2013.01); *G03F 7/203* (2013.01); *G03F 7/2024* (2013.01)

(58) Field of Classification Search
CPC ...... G03F 7/2022; G03F 7/0035; G03F 7/094; G03F 7/203; G03F 7/2024
USPC ....................................................... 238/947
See application file for complete search history.

(56) References Cited

U.S. PATENT DOCUMENTS

| | | | |
|---|---|---|---|
| 6,200,726 B1 | 3/2001 | Chen et al. | |
| 6,338,934 B1 | 1/2002 | Chen et al. | |
| 2010/0255428 A1* | 10/2010 | Chen | G03F 7/0035 430/324 |
| 2011/0281220 A1* | 11/2011 | Matsuda | H01L 21/0273 430/325 |
| 2012/0156881 A1* | 6/2012 | Haffner | H01L 21/0337 438/703 |
| 2014/0342563 A1* | 11/2014 | Light | H01L 21/0337 438/696 |

* cited by examiner

*Primary Examiner* — John P Dulka
*Assistant Examiner* — Charles R Peters
(74) *Attorney, Agent, or Firm* — Heslin Rothenberg Farley & Mesiti P.C.; Teige Sheehan (57) ABSTRACT

Fabrication of a circuit structure is facilitated, in which a first exposure of a multi-layer structure is performed using a first mask, which defines positioning of at least one edge of an element to be formed above a substrate of the multi-layer structure. A second exposure of the multi-layer structure is performed using a second mask, which defines positioning of at least one other edge of the element. At least some material of the multi-layer structure is removed using, at least in part, the defined positioning of the at least one edge and the at least one other edges of the element, to form the element above the substrate. In some examples, multiple elements are formed, the multiple elements being hardmask elements to facilitate an etch process to etch a substrate material.

16 Claims, 6 Drawing Sheets

ALTERNATING SPACE DECOMPOSITION IN CIRCUIT STRUCTURE FABRICATION

BACKGROUND

In circuit structure fabrication, there is a desire to continually increase densities of devices within a given chip area to achieve greater functionality and to reduce manufacturing costs. This desire for large scale integration has led to a continued shrinking of circuit dimensions and device features. The ability to reduce the size of such features is driven by performance enhancements in the lithographic processes by which integrated circuit structures are formed on a wafer. This process is also referred to as photolithography, or simply lithography. As is well known, lithographic processes can be used to transfer a pattern of a photomask to a wafer. Consequently, feature size, line width, and the separation between features and lines are becoming increasingly smaller. Yield is affected by factors such as mask pattern fidelity, optical proximity effects, and photoresist processing. However, existing processes can result in undesirable effects that often times must be countered by either changing the design specification (to increase critical dimension or pitch, as examples) or using additional material, such as additional hardmask layers to protect underlying layers.

BRIEF SUMMARY

The shortcomings of the prior art are overcome and additional advantages are provided through the provision of a method of facilitating fabrication of a circuit structure. The method includes performing a first exposure of a multi-layer structure using a first mask, wherein performing the first exposure using the first mask defines positioning of at least one edge of an element to be formed above a substrate of the multi-layer structure; performing a second exposure of the multi-layer structure using a second mask, wherein performing the second exposure using the second mask defines positioning of at least one other edge of the element; and removing at least some material of the multi-layer structure using, at least in part, the defined positioning of the at least one edge and the at least one other edges of the element, the removing forming the element above the substrate.

Additional features and advantages are realized through the concepts of the present invention. Other embodiments and aspects of the invention are described in detail herein and are considered a part of the claimed invention.

BRIEF DESCRIPTION OF THE DRAWINGS

Aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Described herein are alternating space decomposition techniques in which edges of elements to be formed in a material layer over a substrate are defined using multiple exposures. The edges may defined by exposing a resist material that is disposed over a hardmask material layer. The exposure may include multiple (e.g. two) exposures, where edges of the elements to be formed in the hardmask material layer are defined by the exposures. More particularly, for a single element formed, the positioning of edges of that single element may be defined by the multiple exposures, where one exposure defines positioning of at least one edge of the element, and another exposure defines positioning of at least one other edge of the element. Using multiple different exposures to define edges of a single element enables the edges of that element to be closer in proximity to each other, thereby reducing critical dimension and shrinking overall feature size.

Figure 1A:
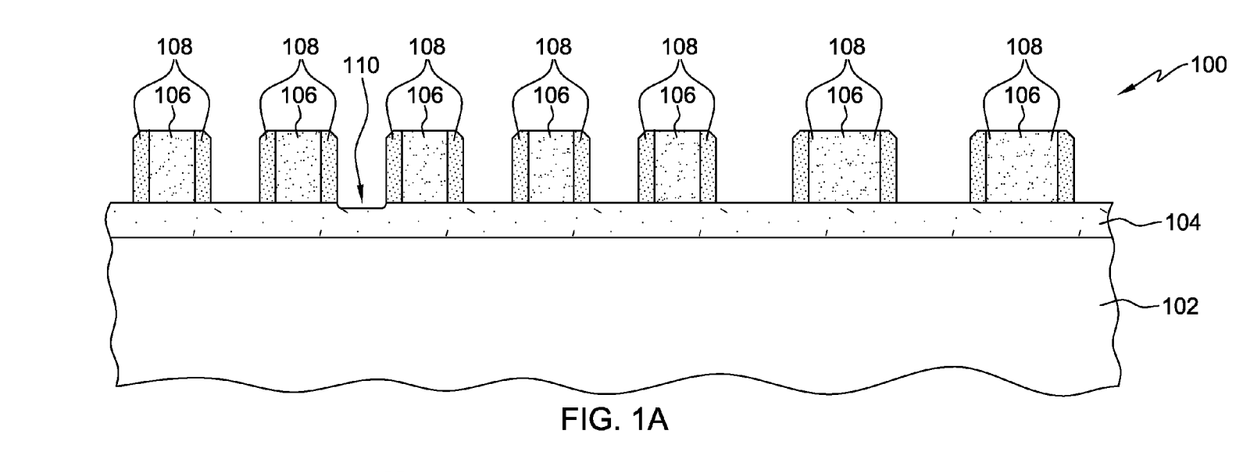
FIGS. 1A and 1B illustrate gouging that can occur in connection with spacer formation during the formation of fin structures.
Figure 1B:
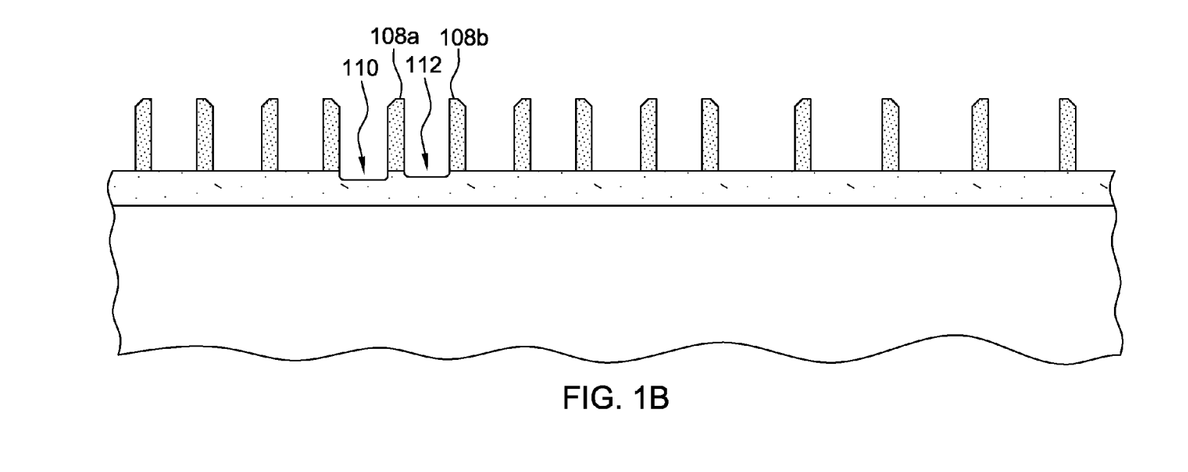

Aspects described herein can also replace existing processes for achieving relatively tight pitch and small critical dimension in, for instance, fin formation. One such existing process is a sidewall image transfer (multiple patterning) process involving spacers. FIGS. 1A and 1B illustrate gouging that can occur in connection with spacer formation during the formation of fin structures.

In FIG. 1A, structure 100 includes a substrate 102, such as a semiconductor substrate, for instance a silicon substrate, and a protective substrate hardmask layer 104. Protective substrate hardmask layer 104 may be a layer of hardmask material, such as silicon nitride (SiN) or titanium nitride (TiN), as examples. Protective substrate hardmask layer 104 is formed over a silicon substrate 102. Mandrels 106 have been formed from a layer of material such as amorphous silicon. After formation of the mandrels, a sidewall spacer layer is conformally provided over and between the mandrels 106 and the hardmask layer 104 using any conventional technique, such as chemical vapor deposition (CVD) or atomic layer deposition (ALD), as examples. Portions of the sidewall spacer layer on top of and between mandrels 106 are etched away by any appropriate non-selective etching process. This forms sidewall spacers 108 along the sidewalls of mandrel structures 106. The width of a sidewall spacer 108 corresponds to critical dimension of the fin to be formed in substrate 102. The width of the sidewall spacer will be translated to a corresponding element formed in the protective hardmask layer 104, which will serve as a mask for etching into the substrate material 102 to form the fin.

This non-selective etching to remove some of the sidewall spacer layer material to form the sidewall spacers can result in over-etching, i.e. downward through a thickness of the sidewall spacer layer between the mandrels 106. An example of this over-etching, termed "gouging", is indicated by 110 in FIG. 1A. Gouging in this case results in etching of a portion of the hardmask layer 104, and thereby disadvantageously results in protective substrate mask thickness variations.

The problems associated with these variations can become compounded when the amorphous silicon material of the mandrels 106 (i.e. between the sidewall spacers 108) is removed. Such removal is typically accomplished by way of selective etching. The selective etching etches the amorphous silicon material of each mandrel 106 between the respective pair of sidewall spacers 108 surrounding the respective mandrel, thereby creating a sidewall spacer pattern as depicted in FIG. 1B. However, height variations in the resultant mask pattern are seen across the protective substrate mask layer 104, as illustrated in FIG. 1B. For instance, over-etching of the amorphous silicon material between spacers 108a and 108b has resulted in gouge 112. Meanwhile, it is possible that gouge 110 has become deeper as a result of this second etch process to remove the amorphous silicon material. Thus, not only may gouging occur, but the degree of gouging may vary across the protective substrate mask layer 104. Moreover, gouging to at least some extent is practically inevitable. While FIGS. 1A and 1B depict only two gouges, it should be understood that gouging occurs across the protective substrate mask layer 104. Additionally or alternatively, under-etching may occur wherein the sidewall spacer layer or amorphous silicon layer are under-etched, resulting in a protrusion above the surface of the protective substrate mask layer 104.

In any case, lack of planarity or uniformity of the protective substrate mask layer 104 may cause undesirable variations in the resultant semiconductor structure, for instance, fin structures and/or gate structures, during subsequent fabrication processing using such a mask formed by the layer. Such variations are unavoidable effects of this processing when dealing with the tight pitch and critical dimensions of today's demands.

Figure 2A:
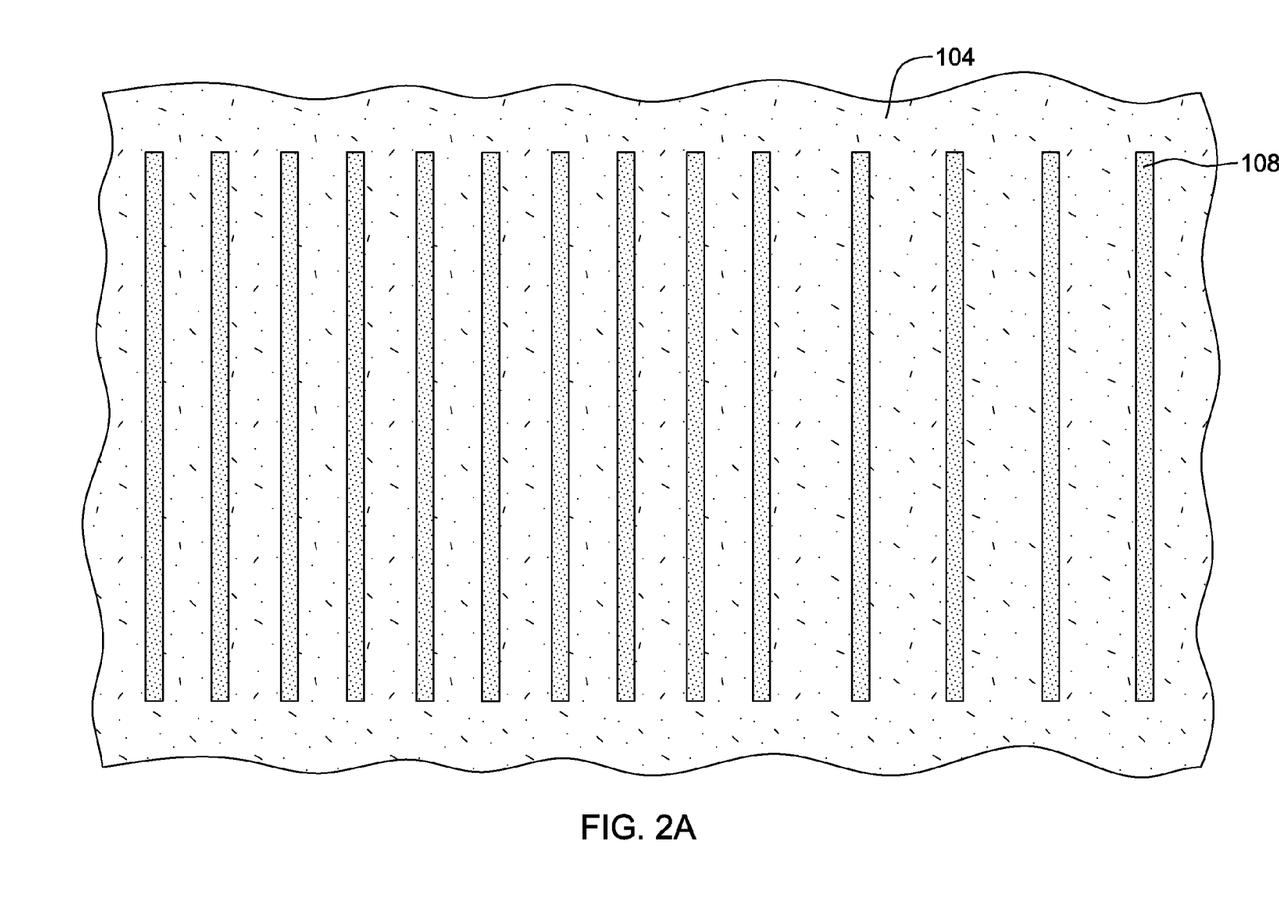
FIGS. 2A and 2B illustrate cuts made across spacers formed during intermediate process steps in the formation of fin structures.
Figure 2B:
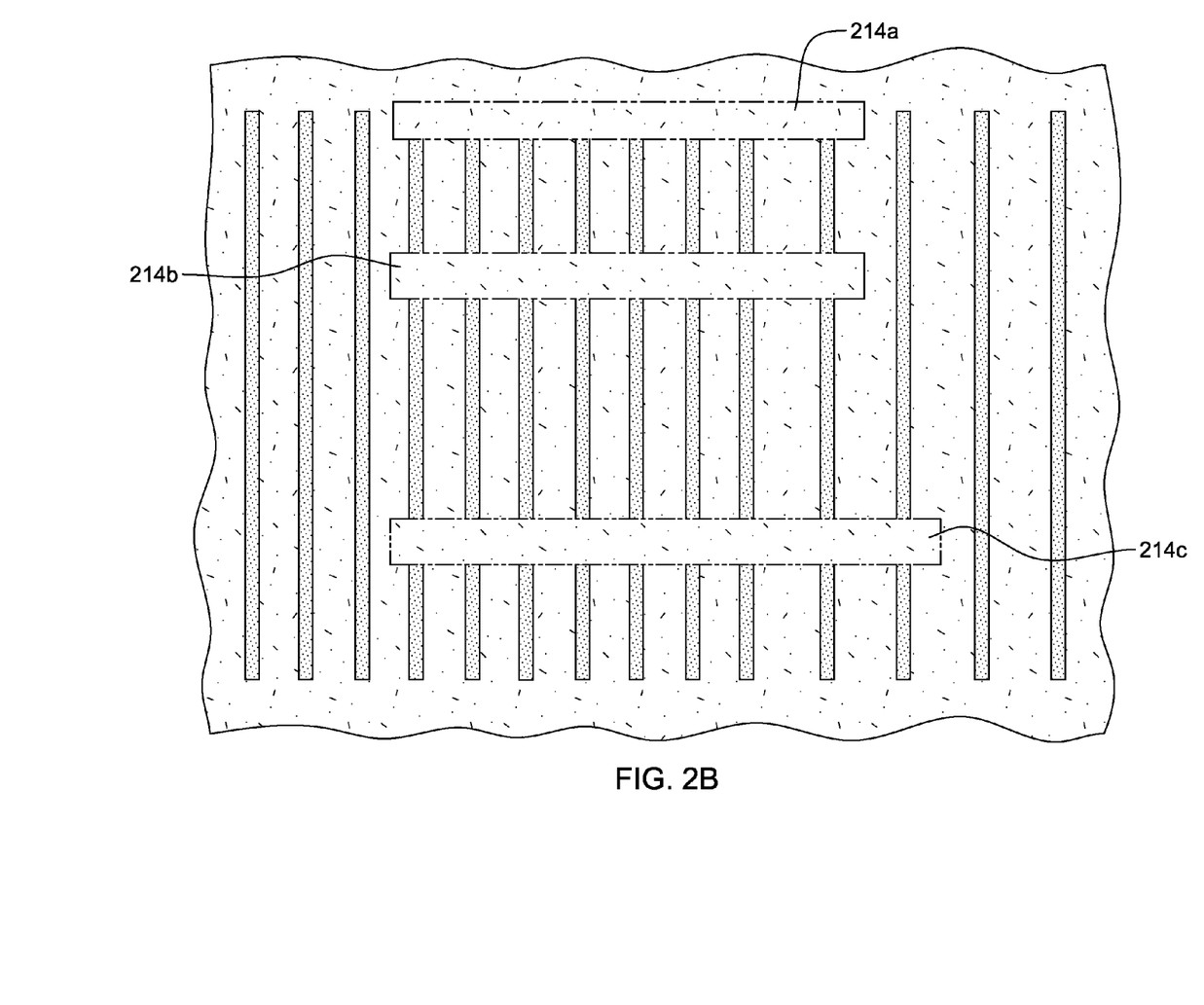

Further problems can result in the cut-formation process performed after sidewall spacers are formed. FIGS. 2A and 2B illustrate cuts made across spacers formed during intermediate process steps in the formation of fin structures.

FIG. 2A presents a top view of FIG. 1B, showing spacers 108 and protective substrate mask layer 104. FIG. 2B shows where cuts 214a, 214b, and 214c are to be made across the spacers. The cuts will be etched down through the protective substrate mask layer 104 to (ideally) the top of substrate 102. Additionally, other areas may be covered by a resist material and another etch may be performed to etch through uncovered areas of the protective substrate mask layer 104.

To produce the final hardmask incorporating fin positioning, sizing, and cuts across the fins as described above, three masks are used. This is complex, time consuming, and costly. Furthermore, this cut process can result in well-known and undesirable effects such as corner rounding and/or line edge roughness, especially at relatively small critical dimensions and pitches.

An alternating space decomposition technique is described herein, which addresses these and other problems. Aspects are described with reference to, and through examples involving, hardmask formation for use in fin structure fabrication, though these aspects may be applied to formation of any desired elements in any patternable material. It is therefore possible to use aspects described herein for patterning any layer, metallization or otherwise, and in any application, not just a fin process. Advantageously provided is the ability to create structures of smaller critical dimension and tighter pitch without the side-effects described above. When applied to fin formation, the ability to create smaller, tighter fins facilitates creation of smaller fin field-effect transistors (FINFETs) and therefore smaller overall structures on wafers.

An alternating space decomposition technique described herein involves formation of patterned elements in a hardmask layer over a substrate layer into which structures (such as fins) will be etched using the hardmask. To pattern the hardmask layer with the elements, a layer of resist may be disposed over the hardmask layer and may be exposed, lithographically for instance, with the use of lithographic masks to define areas of different levels of exposure to light incident on the resist layer. A starting point in terms of aspects described herein may be a substrate (into which structures, such as fins are to be formed), over which a hardmask material layer (of silicon nitride or titanium nitride, as examples) is disposed. Over the hardmask material layer may be a layer of resist used to pattern the hardmask. The hardmask, once patterned, can then be used to pattern the underlying substrate with the desired structures using, for instance, an etch process.

Figure 3A:
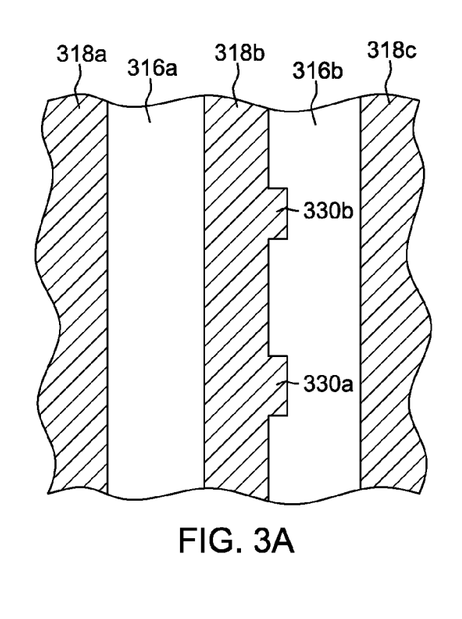
FIGS. 3A-3C illustrate an example of alternating space decomposition to define positioning of edges of elements to be formed above a substrate of a multi-layer structure, in accordance with aspects described herein.
Figure 3B:
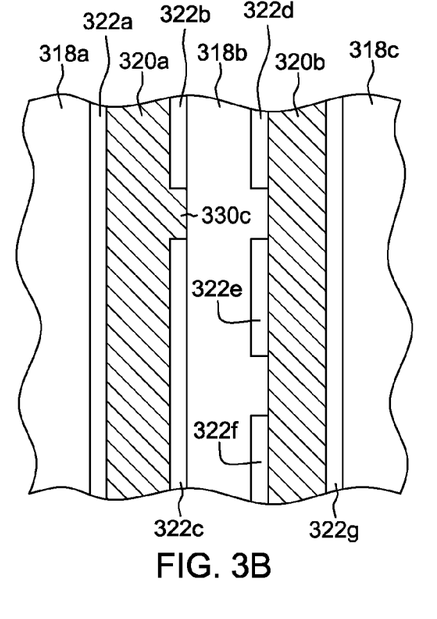
Figure 3C:
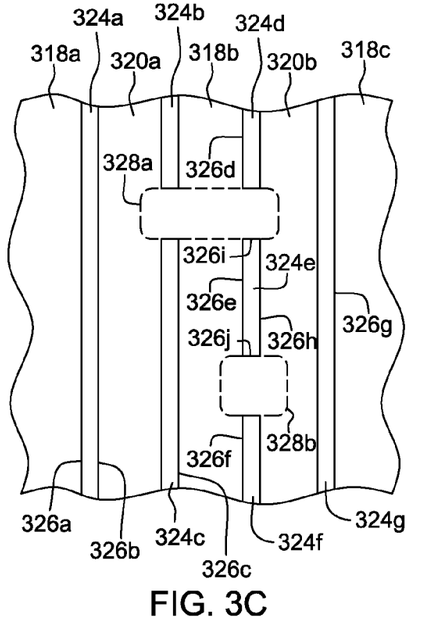

Within this context, FIGS. 3A-3C illustrate an example of alternating space decomposition to define positioning of edges of elements to be formed above a substrate of a multi-layer structure, in accordance with aspects described herein. Referring initially to FIG. 3A, an overhead view is depicted of a multi-layer structure during an intermediate process step in the formation of a circuit structure. At this point in the process, a resist layer covers a hardmask material layer, which itself covers an underlying substrate. A first mask (e.g. a lithographic mask) is used to perform a first exposure of the multi-layer structure. Hatched regions 318a, 318b and 318c depict exposure regions that are defined by the first mask. Regions 318a, 318b and 318c are regions of the resist that can be removed by a first resist material removal process (e.g. by developing and removing the resist) to expose the underlying hardmask material. This underlying hardmask material can itself then be removed (e.g. by etching). Regions 316a and 316b depict regions in which the resist remains intact (at least initially) during that development and the first resist material removal process. It is seen that regions 318a, 318b, and 318c alternate with regions 316a and 316b.

The resist may be a positive resist or a negative resist, and the mask design itself will be configured accordingly to image the appropriate regions. In a photolithographic application involving a positive resist, the first mask will feature opaque portions corresponding to regions 316a and 316b, which are regions in which the resist remains after the first material removal process, and translucent portions corresponding to regions 318a, 318b, and 318c, which are regions in which the resist (and possibly the hardmask material) is removed by first material removal process. Conversely, in a photolithographic application involving a negative resist, the first mask will feature opaque portions corresponding to regions 318a, 318b, and 318c, and translucent portions corresponding to regions 316a and 316b.

FIG. 3B depicts an overhead view of the multi-layer structure after the first exposure is performed, the first material removal process is performed, and regions 318a, 318b, and 318c have been etched down to the underlying substrate. A second mask may then be used to perform a second exposure of the multi-layer structure. Portions of resist in regions 316a and 316b may be exposed as part of this second exposure. In FIG. 3B, hatched regions 320a and 320b depict such exposure regions defined by the second mask. These exposure regions are regions of the resist that can be removed during a second resist material removal process, e.g. by developing and removing the resist to expose the underlying hardmask material. The hardmask material underlying regions 320a and 320b can then be removed (e.g. by etching). Regions 322a-322g depict regions in which the resist remains intact during this process.

FIG. 3C depicts an overhead view of the multi-layer structure after the second exposure and material removal process. The remaining resist (i.e. in regions 322a-322g) can be removed, and what remains are elements 324a-324g over the underlying substrate. Elements 324a-324g are elements of remaining hardmask material, that form a hardmask over the substrate. Regions 318a, 320a, 318b, 320b, and 318a are all regions that have been decomposed, i.e. regions in which the resist has been removed and the hardmask material has been etched away down to the substrate. It is seen that such regions 318a, 318b, and 318c alternate with regions 320a and 320b. It is also seen that elements 324a-324g define hardmask lines (some lines being cut-through). These lines can be used in the formation of, e.g., fins in the substrate material underlying the hardmask.

It should be noted that in the example of FIGS. 3A-3C, after the first exposure, removal of resist, and etching in regions 318a, 318b, and 318c, the resist material remaining in regions 316a and 318b may be removed, and a second resist material may be applied for the second exposure and material removal process. The second resist material may be the same or different from the initial resist material. This may be desired in situations where the initial remaining resist material is rendered insoluble, i.e. such that the second exposure would fail to render regions 320a and 320b soluble for the second removal process. Alternatively, a single material removal step to remove the resist and then etch through the exposed hardmask may be performed after both the first and the second exposures have been performed. For instance, the first exposure may be performed to expose regions 318a-318c, then the second exposure can be performed to expose regions 320a and 320b. These can be performed without developing and removing the resist in regions 318a-318c and without performing any etching through the hardmask in between these exposures. Then, a material removal process can develop/remove the resist and etch down in regions 318a, 318b, 318c, 320a, and 320b.

Performing the first exposure with the first mask defines positioning of edges of hardmask elements to be formed over the substrate. For instance, in FIG. 3A the first exposure using the first mask defines the positioning of edge 326a, which is the left edge of element 324a (FIG. 3C). Edge positioning of a hardmask element is defined by the exposure because the exposure defines an edge in the resist material, and that edge in the resist material becomes translated down to the underlying hardmask material by way of the subsequent material removal process (i.e. develop and remove resist, then etch through the hardmask layer). The first exposure using the first mask also defines the positioning of edges (i) 326b and 326c (the right edges of elements 324b and 324c, respectively), (ii) 326d, 326e, and 326f (the left edges of elements 324d, 324e, and 324f, respectively), and (iii) edge 326g (the right edge of element 326g).

Similarly, performing the second exposure with the first mask defines positioning of other edges of those hardmask elements. The second exposure defines edge 326b, for instance, which is the right edge of element 324a. It is seen then that different exposures using different masks forms different edges of a common hardmask element. Particularly notable is the fact that the width of regions 320a and 320b directly affects the critical dimension of the resulting elements. Widening region 320a produces thinner elements 324a, 324b, and 324c, which translate to thinner (smaller critical dimension) hardmask elements and therefore thinner structures (such as fins) in the underlying substrate.

The first exposure and second exposure each define areas of alternating decomposition. The first exposure exposes regions 318a, 318b and 318c, which alternate with regions 316a and 316b, and are defined by the first mask. The second region exposes regions 320a and 320b. The second mask used in the second exposure may be defined by the areas that are both (i) not exposed by the first mask and (ii) not part of the design (i.e. not above an element 324).

Also provided is the ability to define cuts in the hardmask. Cuts 328a and 328b are shown in FIG. 3C. The cuts, like the elements, are also formed from the interplay between the first exposure using the first mask and the second exposure using the second mask. The first exposure in FIG. 3A defines sizing and positioning of sub-region 330a of region 318b. Sub-region 330a will become cut 328b (i.e. a gap) between elements 324e and 324f. This gap extends horizontally (in this example) from the left side to the right side of elements 324e and 324f. The right edges of elements 324e and 324f are aligned edges defined by the second exposure (specifically, by region 320b). The left edges of elements 324e and 324f are aligned edges defined by the first exposure (specifically, by region 318b). After the material removal process (es) is/are performed, the cut between elements 324e and 324f is fully formed. Similarly, sizing and positioning of sub-region 330b (of region 318a) and sub-region 330c (of region 320a) are defined by the first and second exposures, respectively. After the development/removal of resist, the etching, and the clearing of remaining resist over the elements, cut 328a is formed, which is a special case in which multiple gaps between elements are aligned (horizontally in this example) to define the cut.

Although hardmask elements of virtually any shape and pattern can be formed, the example of FIGS. 3A-3C form substantially parallel lines, some with cuts through them. The parallel lines run vertically (in these examples). Using element 324e as an example, the element features parallel first and second edges 326e and 326h, the positioning of which are defined by the first exposure and the second exposure, respectively. Element 324e also includes edge 362i, which is formed by the first exposure (bottom edge of sub-region 330b) and which is perpendicular to the parallel edges 326e and 326h. Furthermore, element 324e is a quadrilateral element, in which positioning of three adjacent edges (326i, 326e, 326j) is defined by the first exposure, and positioning of the fourth edge, 326h, is defined by the second exposure. Additionally or alternatively, the two exposures could have each defined positioning of a respective pair of adjacent edges of quadrilateral element 324e. If region 330a were instead defined by a protrusion of region 320b in the second exposure, then positioning of edges 326e and 326i would have been defined by the first exposure and positioning of edges 326h and 326j would have been defined by the second exposure.

Multiple elements forming a hardmask may include multiple elements arrayed in one or more directions. In FIG. 3C, the elements are substantially equally spaced apart in the horizontal direction. In other examples, the masks used for the first and second exposures may define positioning of multiple elements spaced evenly apart in perpendicular directions (such as horizontally and vertically).

Figure 4A:
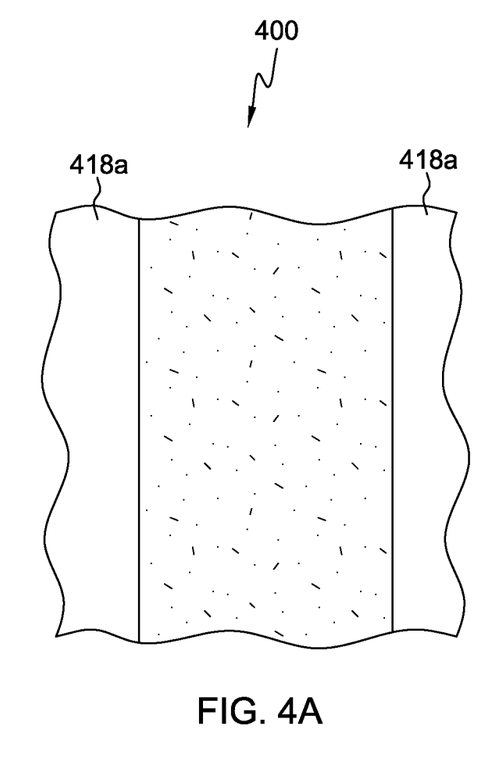
FIGS. 4A and 4B illustrate another example of alternating space decomposition to define positioning of edges of elements to be formed above a substrate of a multi-layer structure, in accordance with aspects described herein.
Figure 4B:
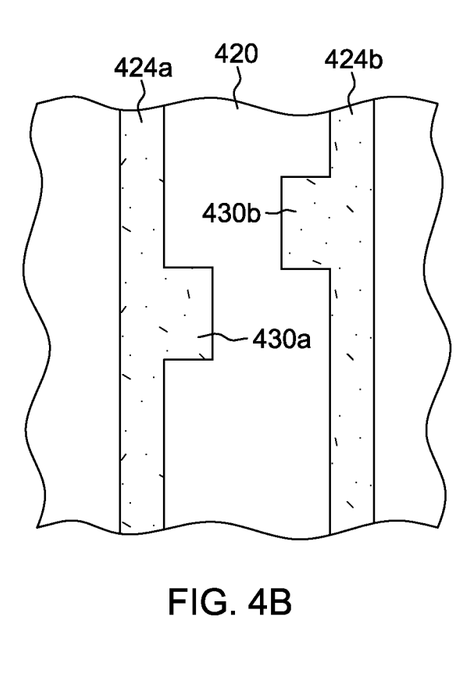

FIGS. 4A and 4B illustrate another example of alternating space decomposition to define positioning of edges of elements to be formed above a substrate of a multi-layer structure, in accordance with aspects described herein. FIG. 4A shown an overhead view of multi-layer structure 400. The multi-layer structure includes a resist layer disposed over a hardmask material layer, which is disposed over an underlying substrate. As above, a first exposure using a first mask can expose regions 418a and 418b. Additionally, a second exposure using a second mask can be performed to expose region 420 (FIG. 4B). The resist material in region 420 can be developed and removed (in a same material process to remove resist in regions 418a and 418, or in a different material removal process) and an etch can be performed (either as part of an etch to etch in regions 418a and 418b, or as a different etch) to etch through the hardmask material in those regions down to the substrate layer. The resulting hardmask elements are elements 424a and 424b. The second mask, used for the second exposure of this example, defines notches 430a and 430b in region 420, which form protrusions in elements 424a and 424b. It may be desirable for elements formed in the hardmask layer to include protrusions of any desired size and shape.

Conversely, it may be desired to form notches in the hardmask elements. One way of accomplishing this is for a first or second mask to define protrusions of an exposed region, which can defines edges of a notch in a resulting element. For instance, in FIG. 3A, if sub-region 330a were a thinner protrusion from region 318b (i.e. thinner than the width of elements 324e and 324f), then gap 328b (FIG. 3C) would not extend completely from the left side of elements 324e and 324f to the right side of elements 324e and 324f. Elements 324e and 324f would in that case instead be a contiguous element with a notch formed therein.

In the case where the elements formed in the material are hardmask elements of a hardmask over a substrate, a material removal process (such as an etch process) may be performed using that hardmask in order to form structures in the substrate layer. A particular application in which hardmask elements of the nature described and depicted with reference to FIGS. 3C and 4C are useful is fin formation. When the hardmask as shown in FIG. 3C is used in an etch process to etch the substrate, the etch forms the final design in one step, fins and cuts included.

Figure 5:
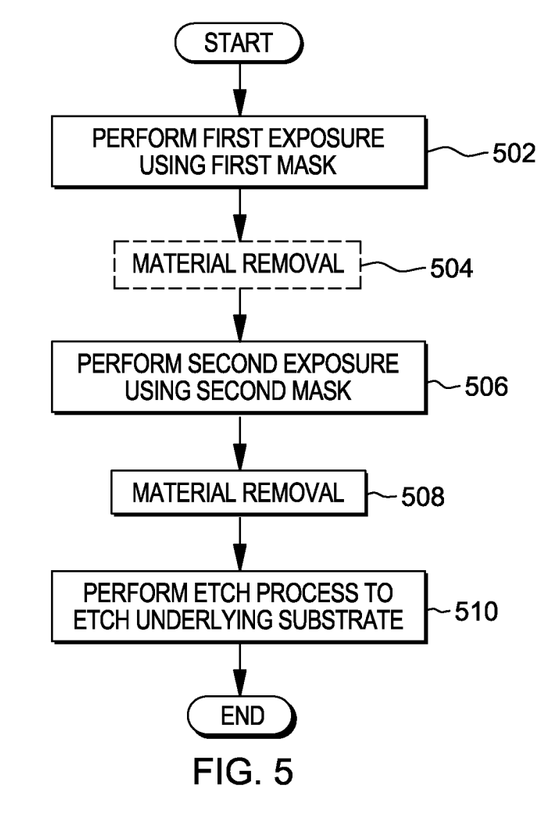
FIG. 5 depicts an example process to facilitate fabrication of a circuit structure, in accordance with aspects described herein.

FIG. 5 depicts an example process to facilitating fabrication of a circuit structure, in accordance with aspects described herein. The method begins by performing a first exposure using a first mask (502). In some examples, the exposure exposes a multi-layer structure comprising a substrate. The multi-layer structure may include a resist material disposed over a hardmask material layer which itself is disposed over the substrate, in which case the exposure exposes portions of the resist material. In other embodiments, additional/other layers are involved and are formed of different materials.

The performance of the first exposure using the first mask defines positioning of at least one edge of an element to be formed above a substrate of the multi-layer structure. The exposure may define positioning of edges of elements formed in the resist material, which are translated down to the hardmask material layer by way of a material removal process described herein, which may include an etch of the hardmask material. Thus, in some examples, the element is being formed in a hardmask material layer, and the element is to form a hardmask element for masking a subsequent etch of the underlying substrate.

The process optionally continues with the performance of a first material removal process (504). This optional step may be performed to remove material of the multi-layer structure, and may form the at least one edge of the element. The material removal uses, at least in part, the positioning of the at least one edge defined by the first exposure. In examples in which a resist is disposed over a hardmask layer in which the element is being formed, the first material removal process may include removal of at least some of the resist (e.g. that was exposed by the first exposure) and optionally some of the hardmask material to form the edge of the element in the hardmask material. In some examples, this material removal step is omitted, and the material removal is performed instead during a subsequent step (see infra at 508).

After performing material removal (504), or if this step is omitted, the process continues by performing a second exposure using a second mask (506). The second exposure may expose the multi-layer structure, and particularly resist material residing at a top layer of the multi-later structure. Performing the second exposure defines positioning of at least one other edge of the element.

The process continues by performing material removal (508). This material removal can remove at least some material of the multi-layer structure using, at least in part, the defined positioning of the at least one edge and/or the at least one other edge of the element. Material removal 508 forms the element above the substrate. In cases where optional material removal 504 was performed, then the element is partly formed after step 504 (i.e. having some of its edges formed) and material removal 508 uses the defined positioning of the at least one other edge to complete the formation of the element. In cases where optional material removal 504 was not performed, then material removal 508 forms the element using the defined positioning of both the at least one edge (defined by the first exposure) and the at least one other edge (defined by the second exposure). That is, the resist is exposed twice prior to any material removal, with each exposure defining at least one edge to complete the shape of the element, and the material removal step removes all of the material surrounding the element.

By way of specific example involving resist material disposed over a material layer in which the element is to be formed, performing the first exposure defines positioning of the at least one edge in the resist material disposed above the material layer in which the element is to be formed and performing the second exposure defines positioning of the at least one other edge in the resist material disposed above the material layer. The positioning of the at least one edge and the at least one other edge defined in the resist material are then translated to the material layer by the material removal 508 (optionally in conjunction with material removal 504).

In particular embodiments, the element being formed includes a line having a first edge and a second edge that are parallel opposing edges of the line. In this case, performing the first exposure defines positioning of the first edge of the line and performing the second exposure defines positioning of the second edge of the line. The line or other element being formed may include a protrusion or a notch extending from a first edge or a second edge, which protrusion or notch includes edges, of the element, that are separate from the first edge and the second edge. The positioning of the edges of the protrusion or notch may also be defined by performing the first exposure or performing the second exposure. In cases where the element is a quadrilateral element, performing the first exposure can define positioning of at least two adjacent sides of the quadrilateral element and performing the second exposure can define positioning of the remaining one or more sides of the quadrilateral element.

As noted above, optional material removal 504 may remove some material of the multi-layer structure to form at least one edge of the element, while material removal 508 removes additional material of the multi-layer structure, to form the at least one other edge of the element. In cases where the multi-layer structure includes a resist material disposed above a material layer in which the element is to be formed, the first material removal (504) may remove, after performing the first exposure, at least some resist of the resist material and at least some material of the material layer, and form the at least one edge of the element. Then, an intermediate process step may be performed, which reapplies resist material after performing this first material removal 504 and prior to performing the second exposure. Reapplying the resist material may protect the formed at least one edge of the element from the second exposure. The second exposure (506) may expose some of the reapplied resist material, and the second material removal process (508) may remove some of this reapplied resist material as well as some of the material of the material layer, and form the at least one other edge of the element.

It is seen that the first exposure (503) and the second exposure (506) may be temporally separate exposures, and the first material removal (504) and the second material removal (508) may be temporally separate material removals.

Additionally, the first exposure and second exposure may each define positioning of edges of multiple elements to form above the substrate, where each of these multiple elements are physically separated. The physical separation may be achieved, in some examples, by the first exposure and/or the second exposure defining sizing and positioning of a gap between at least two elements of the multiple elements. In some examples, such a gap is formed by a protrusion in a region exposed by one of the first exposure or the second exposure. The first exposure can define positioning of multiple aligned edges of the multiple elements, with the multiple aligned edges being on one side of the multiple elements, and the second exposure can define positioning of multiple other aligned edges of the multiple elements, the multiple other aligned edges being on another side of the multiple elements. The gap(s) between the multiple elements may extend from the one side to the another side of the multiple elements.

Additionally or alternatively, the multiple elements may be arrayed in one or more directions. The elements can be arrayed in a first direction perpendicular to a second direction. The array may be achieved by the first exposure and/or the second exposure defining positioning of multiple aligned gaps between the elements, the aligned gaps being aligned in the first direction and/or the second direction.

As noted above, the element(s) being formed may include mask element(s) formed in a hardmask material layer above the substrate. The first exposure can define positioning of at least one edge for each mask element of multiple mask elements to form in the hardmask material layer, and the second exposure can define positioning of at least one other edge for each mask element of the multiple mask elements. The removing the at least some material (i.e. by 508 or a combination of 508 and 504) can form the multiple mask elements above the substrate. In this example, the formation of the multiple mask elements forms a hardmask. A plurality of these mask elements may be arrayed on the substrate.

Returning to FIG. 5, the process can proceed by performing an etch process to etch the underlying substrate (510). In the example where a hardmask is formed, the etch process removes material by making use of the formed hardmask. In particular embodiments, the etch forms a plurality of fins into the substrate, and the arrayed mask elements protect portions of the substrate underlying the arrayed mask elements during performance of the etch process to form the plurality of fins into the substrate. As noted above, the first exposure and/or second exposure can also define positioning of a gap between two mask elements of the multiple mask elements of the hardmask. In the case of fin formation, that gap can define a cut to be formed across a fin of the plurality of fins during the etch process. In that way, both the fins and the cut are formed by the etch process performed using the hardmask, thus the cut and the fins may advantageously be etched together in a single etch of the substrate using the hardmask. Additionally, the first and/or second exposure can define positioning of multiple aligned gaps between at least two mask elements of the multiple mask elements of the hardmask. The multiple aligned gaps can define a cut that is to be formed across at least two fins of the plurality of fins, in which case the etch process performed using the hardmask forms the fins and the cut across those fins in a single etch of the substrate using the hardmask.

A benefit of aspects described herein is the elimination of third mask and separate to define the cuts to be made through the fins. Further, the spacer formation process is eliminated, since no spacers are used.

Conventionally, a single given hardmask structure is formed using a single mask for defining all edges of the mask element. In line formation in a resist, a single mask would pattern the edges of every other line (1, 3, 5, etc.), while another mask (or the same mask in a different exposure) would pattern the edges of lines 2, 4, 6, etc. This would effectively cut the pitch (distance between adjacent lines) in half, since it was not possible to achieve the distance between adjacent lines using a single mask and exposure. As described herein, the use of two separate exposures (instead of one) to form different edges of a single resist element, which gets translated to a single hardmask element, enables reduction in critical dimension of the elements. Smaller critical dimension can be achieved by widening a region exposed by the second exposure, which thins the resulting elements formed in the resist, as described above.

Conventionally, due to current limitations of lithographic tools, one approach to forming lines for some critical layer has been to print the line larger, initially in the lithographic process, but then etch the line to trim it down to a desired design value (critical dimension). As an arbitrary example, a lithographically printed line is formed at 55 nm (relatively large, due to limitations of the lithographic tool), with a spacing of 55 nm. Pitch in that case is 110 nm. Then, the line is etched/trimmed to the desired specification, say 30 nm wide. The resulting space, which was 55 nm, is now 80 nm (pitch remains 110 nm). In such a conventional approach, the targeted space width (80 nm in this example) was much larger than the targeted line width (30 nm in this example), in order to allow for the printing of the larger (55 nm) line in the lithographic phase. Aspects described herein enable printing of the 80 nm space directly using the same, or perhaps less advanced, lithographic equipment. Printing the 80 nm space directly may be more cost effective and easier than the conventional process of printing a 55 nm space and line, then thinning the line with added complexity of the etch processing. This may be achieved without the need for more advanced lithographic equipment; the same lithographic tools as those with the limitations described above may be used.

Continuing with the above example, if not only the critical dimension of the elements, but also the spacing between elements, can be reduced (e.g. reduce spacing to below 80 nm while maintaining the minimum critical dimension) to some minimum achievable space dimension of the tool, then pitch (on-center spacing of adjacent elements) can be reduced. In some cases, spacing between adjacent elements can be reduced to about 1.5× (or smaller) the minimum critical dimension achievable for those elements, in comparison to conventional minimum spacing value of about 2× (or larger) the minimum critical dimension.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of facilitating fabrication of a circuit structure, the method comprising:
   performing a first exposure of a resist layer of a multi-layer structure using a first mask, wherein performing the first exposure using the first mask defines positioning of at least one edge of one or more of a plurality of mask elements to be formed in a hardmask layer above a substrate of the multi-layer structure;
   performing a second exposure of the resist layer of the multi-layer structure using a second mask, wherein performing the second exposure using the second mask defines positioning of at least one other edge of the one or more of the plurality of mask elements;
   forming a hardmask comprising the plurality of mask elements above the substrate, wherein forming comprises removing at least some material of the multi-layer structure using, at least in part, a defined positioning of the at least one edge and the at least one other edge of the one or more of the plurality of mask elements, the removing forming the plurality of mask elements above the substrate; and
   subsequent to forming the hardmask, performing a material removal process using the formed hardmask, wherein performing the material removal process comprises forming a plurality of fins in the substrate, and wherein the arrayed mask elements protect portions of the substrate underlying the arrayed mask elements during performance of the material removal process.

2. The method of claim 1, wherein the removing comprises:
   performing a first material removal after performing the first exposure and prior to performing the second exposure, the first material removal removing material of the multi-layer structure to form the at least one edge of the one or more of the plurality of mask elements; and
   performing a second material removal after performing the second exposure, the second material removal removing additional material of the multi-layer structure to form the at least one other edge of the one or more of the plurality of mask elements.

3. The method of claim 2, wherein the first exposure and the second exposure are temporally separate exposures, and wherein the first material removal and the second material removal are temporally separate material removals.

4. The method of claim 1, wherein performing the first exposure defines positioning of the at least one edge of the one or more of the plurality of mask elements in resist material disposed above a material layer in which the plurality of mask elements is to be formed and performing the second exposure defines positioning of the at least one other edge of the one or more of the plurality of mask elements in the resist material disposed above the material layer, wherein the positioning of the at least one edge and the at least one other edge defined in the resist material are translated to the material layer during the removing the at least some material.

5. The method of claim 1, wherein the multi-layer structure comprises a resist material disposed above a material layer in which the plurality of mask elements is to be formed, wherein removing the at least some material comprises, after performing the first exposure, performing a first material removal to remove at least some resist of the resist material and at least some material of the material layer, the performing the first material removal forming the at least one edge of the one or more of the plurality of mask elements, and wherein the method further comprises reapplying resist material after performing the first material removal and prior to performing the second exposure, wherein reapplying the resist material protects the formed at least one edge of the one or more of the plurality of mask elements from the second exposure.

6. The method of claim 1, wherein the one or more of the plurality of mask elements comprise a line having a first edge and a second edge, the first edge and second edge being parallel opposing edges of the line, and wherein performing the first exposure defines positioning of the first edge of the line and performing the second exposure defines positioning of the second edge of the line.

7. The method of claim 6, wherein the one or more of the plurality of mask elements comprise a protrusion extending from the first edge or the second edge, and wherein the protrusion comprises edges of the one or more of the mask elements separate from the first edge and the second edge, the positioning of the edges of the protrusion defined by performing the first exposure or performing the second exposure.

8. The method of claim 6, wherein the one or more of the plurality of mask elements comprise a notch extending from the first edge or the second edge, and wherein the notch comprises edges of the one or more of the plurality of mask elements separate from the first edge and the second edge, the positioning of the edges of the notch defined by performing the first exposure or performing the second exposure.

9. The method of claim 1, wherein the one or more of the plurality of mask elements is a quadrilateral element, wherein performing the first exposure defines positioning of at least two adjacent sides of the quadrilateral element and performing the second exposure defines positioning of the remaining one or more sides of the quadrilateral element.

10. The method of claim 1, wherein performing the first exposure and performing the second exposure defines positioning of edges of multiple mask elements to form above the substrate, the multiple mask elements being physically separated.

11. The method of claim 10, wherein performing at least one exposure of the first exposure or the second exposure defines positioning of a gap between at least two elements of the multiple mask elements.

12. The method of claim 10, wherein performing the first exposure defines positioning of multiple aligned edges of the multiple mask elements, the multiple aligned edges being on one side of the multiple mask elements, and performing the second exposure defines positioning of multiple other aligned edges of the multiple mask elements, the multiple other aligned edges being on another side of the multiple mask elements.

13. The method of claim 12, wherein performing at least one exposure of the first exposure or the second exposure defines positioning of at least one gap between the multiple mask elements extending from the one side to the another side thereof.

14. The method of claim 12, wherein the multiple mask elements are arrayed in a first direction and a second direction, the first direction being perpendicular to the second direction, and wherein performing at least one exposure of the first exposure or the second exposure defines positioning of multiple aligned gaps between the multiple elements in the first direction or the second direction.

15. The method of claim 1, wherein performing at least one exposure of the first exposure or the second exposure defines positioning of a gap between two mask elements of the plurality of mask elements, wherein the gap defines a cut to be formed across a fin of the plurality of fins during the material removal process, and wherein the material removal process forms the plurality of fins and the cut.

16. The method of claim 15, wherein performing the at least one exposure of the first exposure or the second exposure defines positioning of multiple aligned gaps between at least two mask elements of the plurality of mask elements, wherein the multiple aligned gaps define the cut, the cut to be formed across at least two fins of the plurality of fins, wherein the material removal process forms the plurality of fins and the cut.

* * * * *